(12) United States Patent
Leipold

(10) Patent No.: US 7,575,969 B2
(45) Date of Patent: Aug. 18, 2009

(54) BURIED LAYER AND METHOD

(75) Inventor: Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1498 days.

(21) Appl. No.: 09/798,106

(22) Filed: Mar. 2, 2001

(65) Prior Publication Data

US 2001/0048135 A1    Dec. 6, 2001

Related U.S. Application Data

(60) Provisional application No. 60/186,384, filed on Mar. 2, 2000.

(51) Int. Cl.
*H01L 21/8238* (2006.01)

(52) U.S. Cl. .............. 438/223; 438/199; 438/210; 438/218; 438/224; 438/532; 438/527

(58) Field of Classification Search .......... 257/345, 257/349–351, 369–376, 544–548; 438/199–200, 438/210, 217–224, 227–229, 232, 510, 519, 438/527

See application file for complete search history.

(56) References Cited

U.S. PATENT DOCUMENTS

| 5,304,833 | A | * | 4/1994 | Shigiki et al. | 257/372 |
|---|---|---|---|---|---|
| 5,386,135 | A | * | 1/1995 | Nakazato et al. | 257/369 |
| 5,573,963 | A | * | 11/1996 | Sung | 438/217 |
| 5,789,288 | A | * | 8/1998 | Palmieri et al. | 438/234 |
| 5,831,313 | A | * | 11/1998 | Han et al. | 257/371 |
| 5,989,949 | A | * | 11/1999 | Kim et al. | 438/217 |
| 6,004,838 | A | * | 12/1999 | Ma et al. | 438/200 |
| 6,097,078 | A | * | 8/2000 | Sim et al. | 257/548 |
| 6,127,710 | A | * | 10/2000 | Choi et al. | 257/410 |
| 6,133,081 | A | * | 10/2000 | Kim | 438/227 |
| 6,143,594 | A | * | 11/2000 | Tsao et al. | 438/199 |
| 6,144,076 | A | * | 11/2000 | Puchner et al. | 257/369 |
| 6,211,555 | B1 | * | 4/2001 | Randazzo et al. | 257/368 |
| 6,228,726 | B1 | * | 5/2001 | Liaw | 438/294 |
| 6,232,165 | B1 | * | 5/2001 | Wong | 438/221 |
| 6,303,419 | B1 | * | 10/2001 | Chang et al. | 438/202 |
| 6,303,969 | B1 | * | 10/2001 | Tan | 257/484 |
| 6,433,392 | B1 | * | 8/2002 | Amerasekera et al. | 257/355 |
| 6,531,363 | B2 | * | 3/2003 | Uchida | 438/275 |

* cited by examiner

*Primary Examiner*—Ori Nadav

(74) *Attorney, Agent, or Firm*—Ronald O. Neerings; Wade James Brady, III; Frederick J. Telecky, Jr.

(57) ABSTRACT

A high resistivity silicon for RF passive operation including CMOS structures with implanted CMOS wells and a buried layer under the wells formed by deep implants during well implantations.

23 Claims, 6 Drawing Sheets

BURIED LAYER AND METHOD

CROSS-REFERENCE TO RELATED APPLICATIONS

The present application claims priority from provisional patent application Ser. No. 60/186,384, filed Mar. 2, 2000. The following copending and coassigned patent application discloses related subject matter: Ser. No. 09/312,511, filed May 14, 1999.

BACKGROUND OF THE INVENTION

The present application relates to semiconductor electronic devices, and more particularly to methods of fabrication of semiconductor integrated circuits.

Integrated circuits for high frequencies ideally contain both CMOS active devices plus passive components and additionally diodes and transmission lines. However, integrated circuits produced with present-day conventional processes suffer from the disadvantage that the passive components required in the circuit, such as coil inductors and capacitors, have a low Q-factor when used in typical high frequency applications such as input stages for symmetrical mixers for impedance transformers. This low Q-factor is attributable to undesirable capacitive coupling, and to the generation of eddy currents flowing in the conducting semiconductor substrate, made possible by the great number of charge carriers existing in such a semiconductor substrate.

Passive components with a low Q-factor are not desirable in high frequency circuits, because they require the use of additional active stages in order to compensate for the energy losses caused on account of the low Q-factor. In addition to this, the use of components with a low Q-factor results in increased noise figures. However, and in particular in the case of CMOS circuits, the use of passive components is unavoidable because the CMOS components present a strictly capacitive input impedance, so that normally a coil with a high inductance must be used, for the purpose of impedance matching, which acts in series-resonance with the input capacitance of the MOS transistor. In such a typical application, in particular, the low Q-factor with which the coil can be produced, is of great disadvantage.

SUMMARY OF THE INVENTION

The present invention provides CMOS integrated circuits in high resistivity semiconductor with buried layers under CMOS wells where the buried layer is implanted in junction with the wells.

This has advantages including high Q-factor for passives formed away from the buried layers while the buried layers deter CMOS latch-up. The high resistivity deters passive component eddy currents.

BRIEF DESCRIPTION OF THE DRAWINGS

The drawings are heuristic for clarity.

DESCRIPTION OF THE PREFERRED EMBODIMENTS

Figure 1:
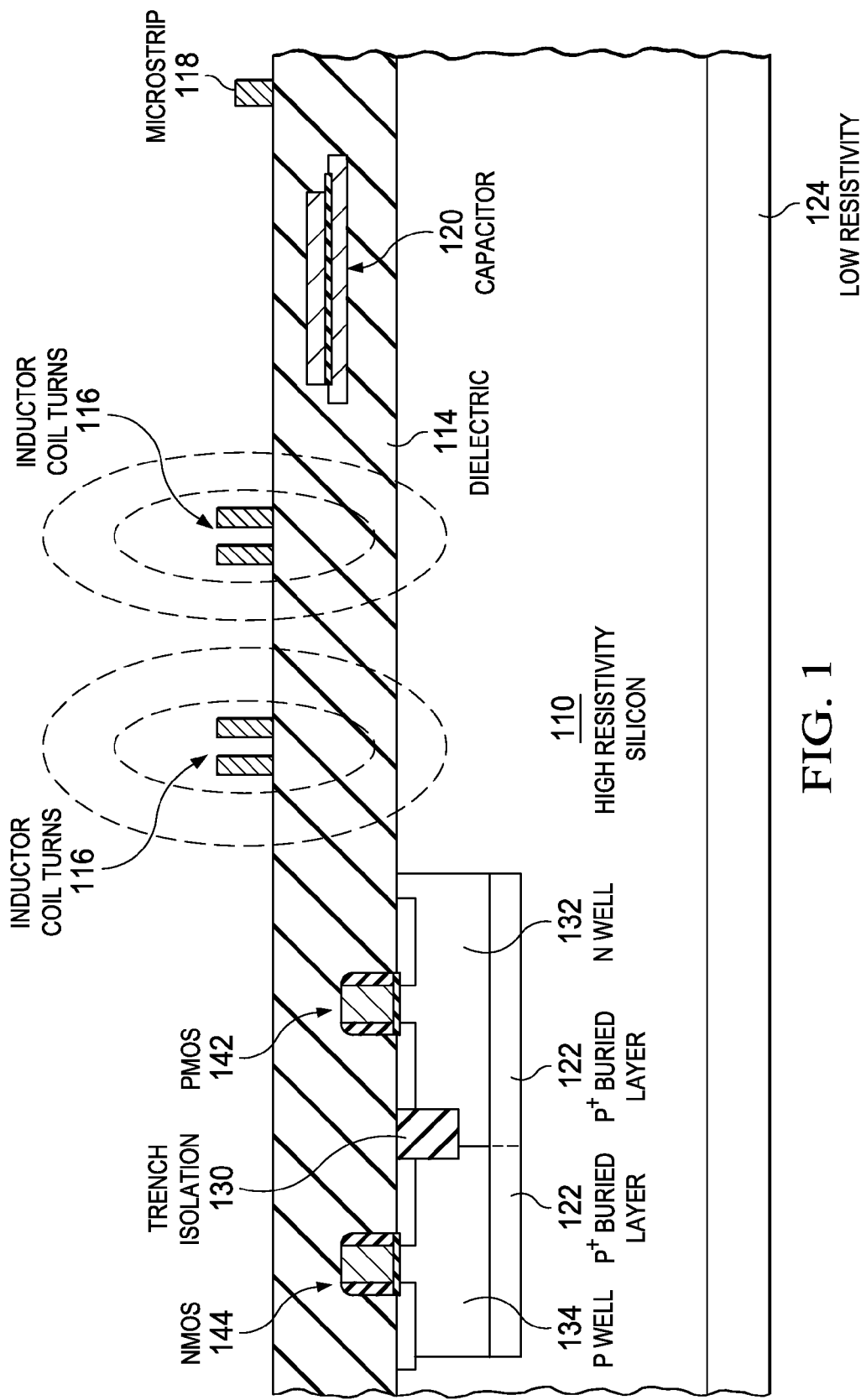
FIG. 1 is a cross-sectional elevation view of a first preferred embodiment.
Figure 2:
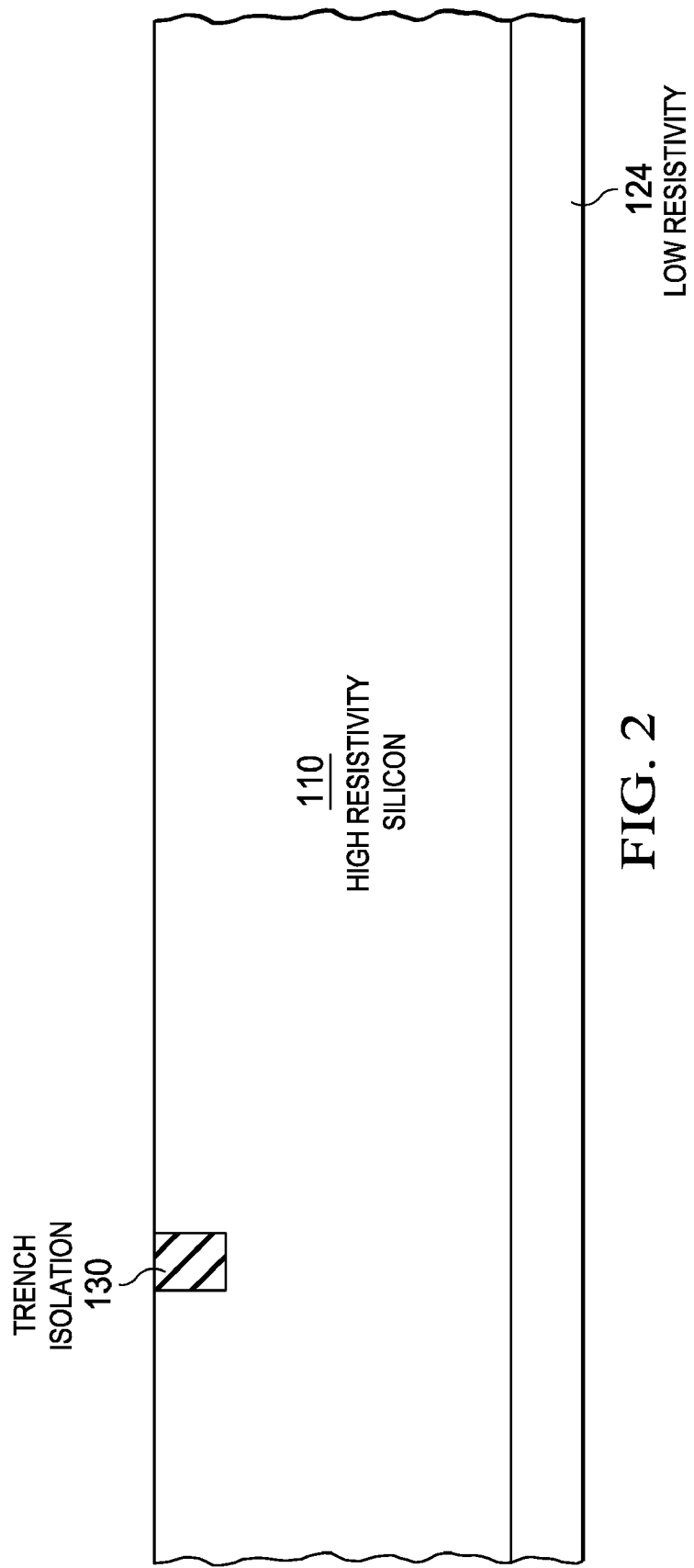
FIGS. 2-6 illustrate preferred embodiment method steps.
Figure 3:
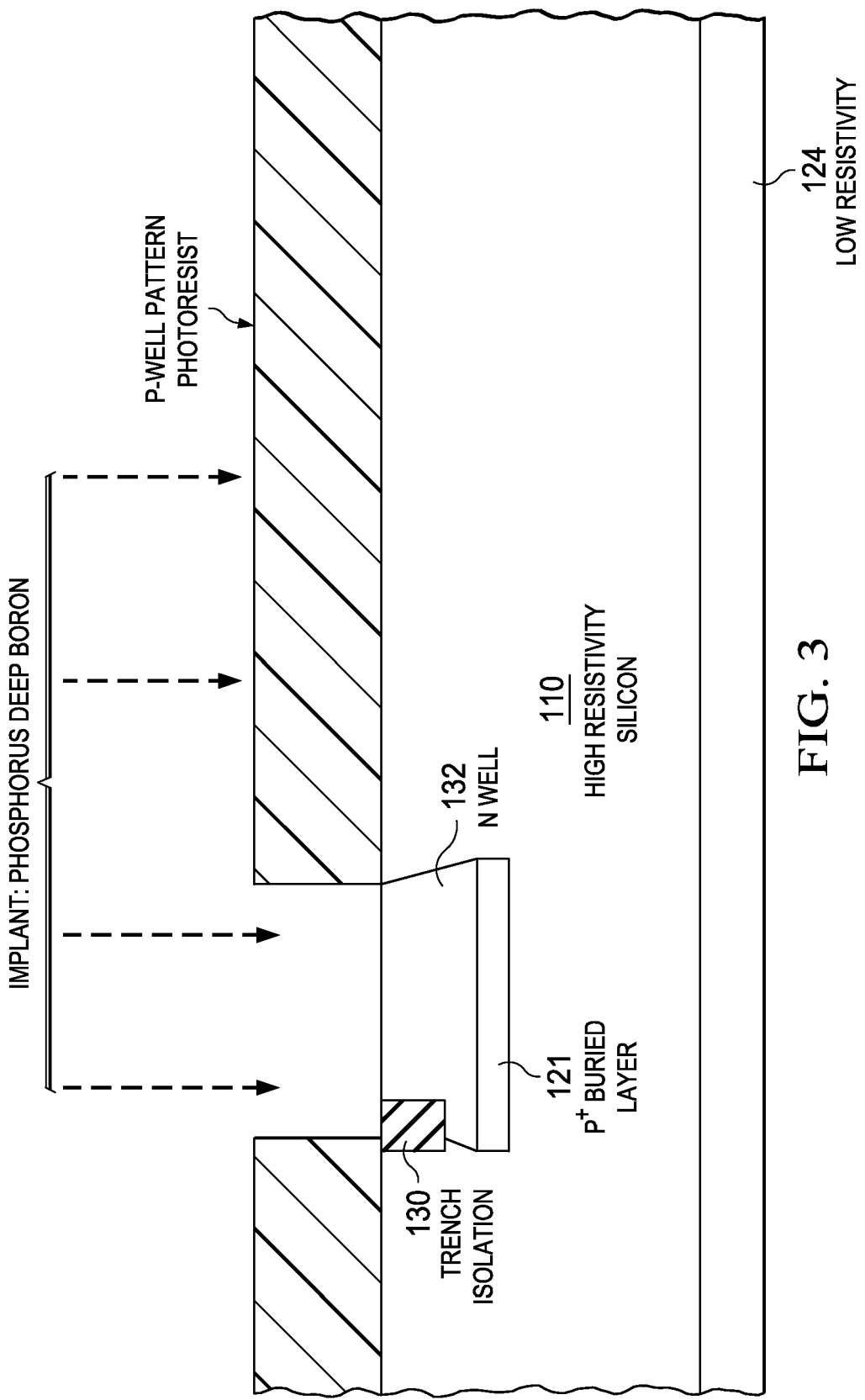
Figure 4:
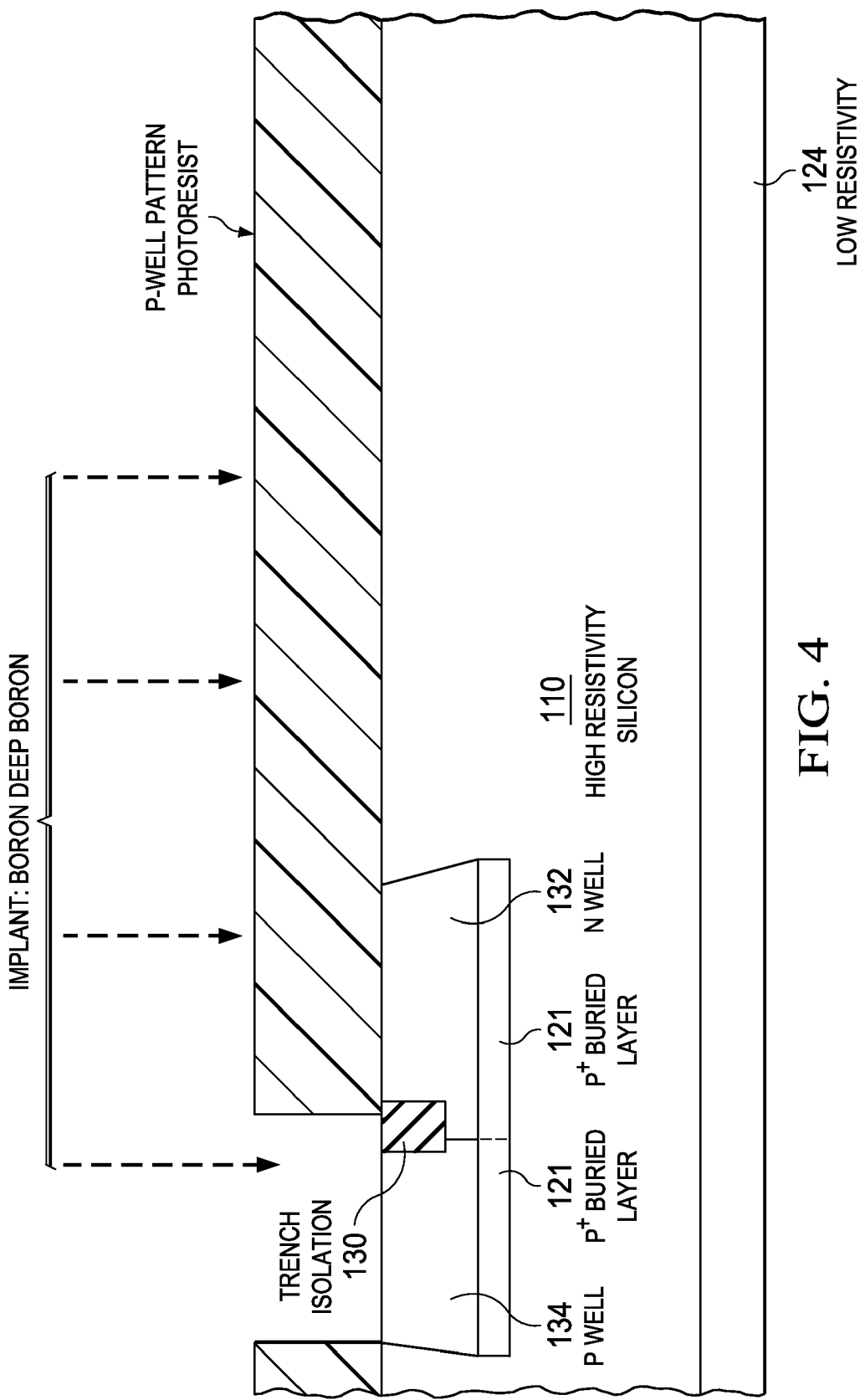
Figure 5:
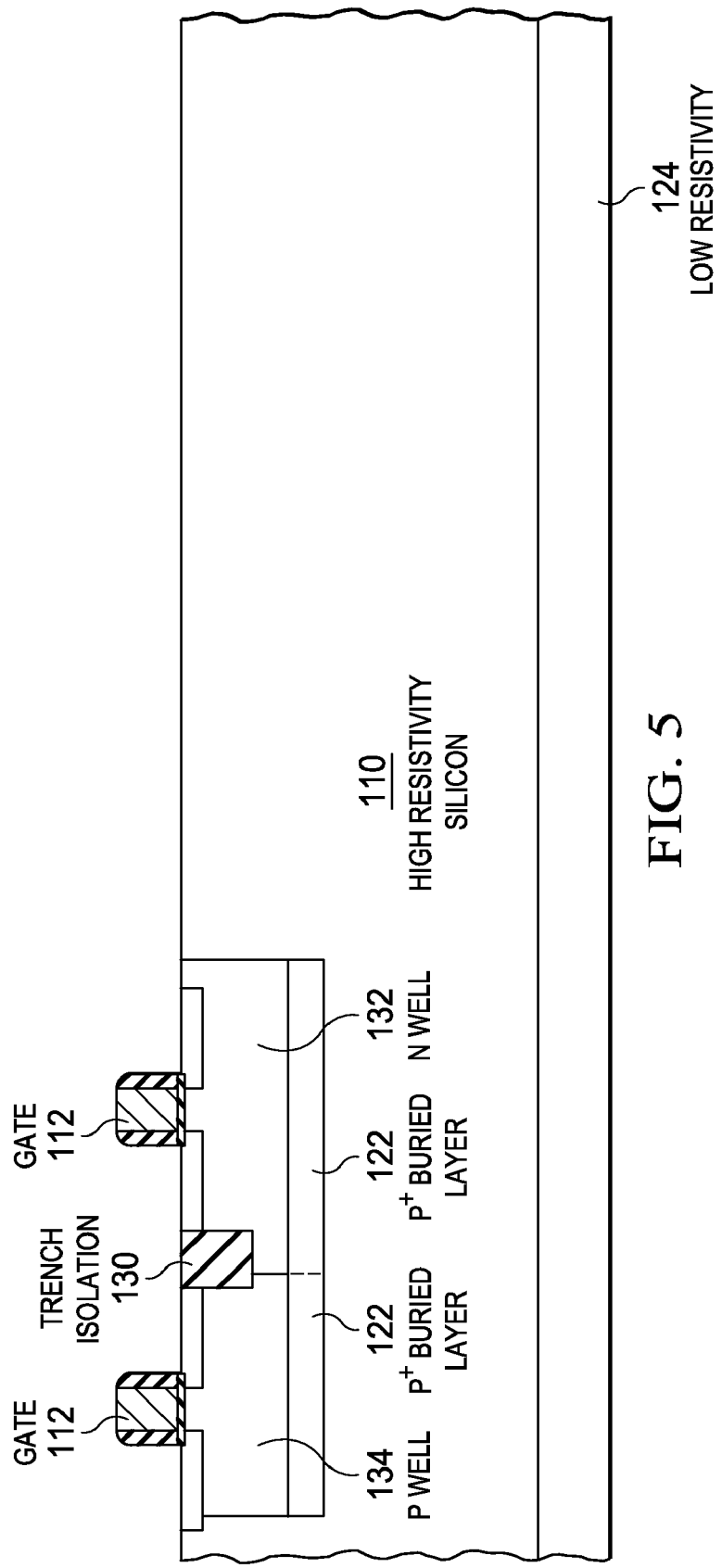
Figure 6:
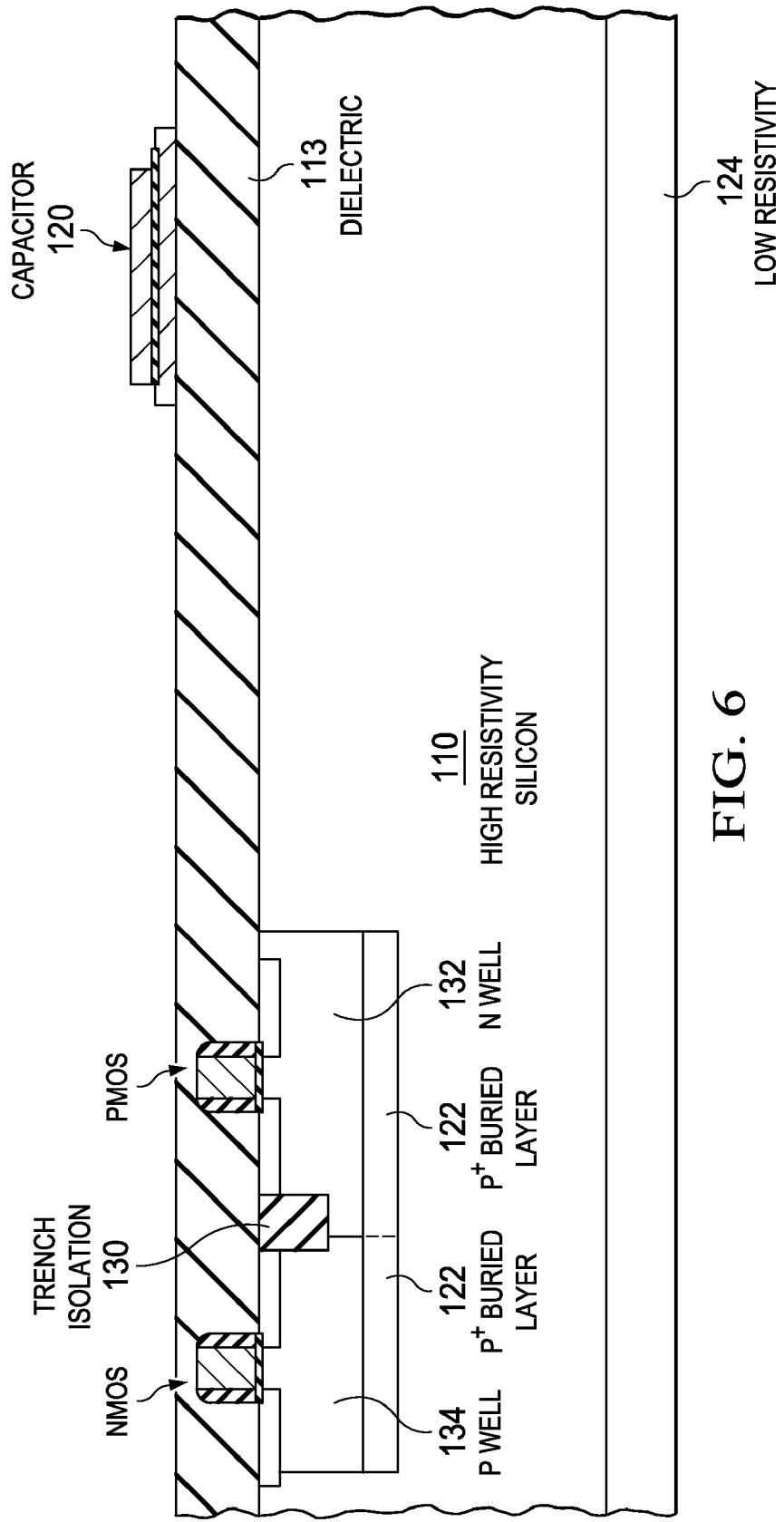

FIG. 1 illustrates in cross-sectional elevation view a portion of a preferred embodiment integrated circuit with a high resistivity silicon layer 110, low resistivity back side layer 124, PMOS transistor 142, NMOS transistor 144, shallow trench isolation 130, dielectric layer 114, capacitor 120, inductor coil turns 116 including indications of magnetic field lines about the coil turns, and microstrip line 118. High resistivity silicon 110 has a resistivity of 5 kohm-cm (a doping level of roughly $10^{12}$-$10^{13}$ atoms/cm$^3$); whereas, low resistivity backside layer 124 (which may be heavily doped silicon or metal or a stack of doped silicon plus metal) has a resistivity of at most roughly 0.01 ohm-cm (for silicon a doping level of roughly $10^{19}$ atoms/cm$^3$). The high resistivity of silicon 110 leads to low losses and high Q-factors for the inductor and capacitor.

FIG. 1 is schematic and for clarity shows only a single PMOS and NMOS transistor and omits other possible active devices such as diodes together with the interconnects among the active devices plus passive components. Passive components are formed on dielectric layer 114; the turns of coil 116 as well as conductor 118 of a microstrip line are shown as examples. The broken lines about the turns of coil 116 represent the field lines of a magnetic field caused by the coil, which may induce eddy currents in the underlying silicon layer 110. As a further example of a passive component, capacitor 120 is formed in dielectric layer 114. Dielectric layer 114 may consist, for example, of silicon dioxide, silicon nitride, fluorinated silicon dioxide, and so forth. The active and passive components shown only represent examples of components which are used in conventional high frequency circuits. Other components may be included in the circuit, such as bipolar transistors, Schottky diodes, tunnel diodes or similar devices.

Buried layer 122 in high resistivity silicon 110 under the MOS transistors prevents any latch-up effect, that is the triggering of a parasitic thyristor formed by PMOS plus NMOS devices while certain potential conditions prevail. On account of the high resistivity of silicon 110, the problem of capacitive coupling and the generation of eddy currents in the silicon can only occur to a very limited extent, so that the passive components attain a high Q-factor. Contact layer 124 on the backside of silicon 110 makes certain that the residual eddy currents induced in the silicon 110 are bled away, so that they cannot influence the behavior of other components included in the circuit.

Silicon layer 110 may consist of either n-type or p-type, although in either case impurity levels are quite low to achieve the high resistivity. Note that for n-type silicon 110, the p well 134 containing NMOS transistor 144 may be biased to any desired potential between ground and the positive bias of the n well 132 and n-type silicon 110. This provides advantages with RF amplifiers in common gate configuration.

Backside contact 124 can be heavily doped silicon or metal; using silicon with the same conductivity type as silicon 110 has the advantage of bleeding away free charge in silicon 110. It is, however, also possible to form a contact layer 124 which is of a conductivity type opposed to that of silicon 110, and in such a case a barrier depletion layer is created between the silicon 110 and the contact layer 124 and may be arranged to create a space charge region large enough to deplete the entire silicon layer 110 of charge carriers, which will have a favorable effect as regards the RF behavior of the passive components. In the case of an n-type silicon layer 110, contact 124 of the circuit is connected to the positive supply line, when in operation, to ensure that the free electrons occurring in the silicon layer 110 are bled away. In the case of a p-type silicon layer 110, the contact layer 124 is grounded for the purpose of bleeding away any free holes. Note that silicon 110 being only 5 um thick implies backside contact silicon 124 would be on the order of 500 um thick.

The fabrication process described in the following provides CMOS circuits in which Schottky diodes having very low stray capacitance may be created. This has an advantage for use of diodes as part of RF switching devcies and bridge mixers. Furthermore, high quality impedance transformers may be produced because the coil inductor has high Q-factor. It is also easy to produce tunnel diodes which may be used as third order frequency multipliers.

A first preferred embodiment method of fabrication for the structure of FIG. 1 includes the followings steps, which FIGS. 2-6 illustrate.

(1) Start with a (100)-oriented n+ silicon wafer 124 with very lightly doped n-type epitaxial layer 110 of thickness 5 um. The resistivity of epilayer 110 is 5 kohm-cm (e.g., dopant concentration of $10^{12}$ atoms/cm$^3$), whereas the resistivity of wafer 124 is 0.01 ohm-cm and forms a backside contact. Form shallow trench isolation 130 by plasma etching trenches in epilayer 110 to a depth of about 0.3 um and width 0.2 um and filling the trenches with dielectric by blanket deposition followed by chemical mechanical polishing to remove dielectric outside of the trenches; see FIG. 2. The shallow trench isolation may include thin polish stop layers such as silicon nitride which are not shown.

(2) Spin on photoresist, expose, and develop a pattern for the n wells 132 for PMOS transistors. Next, implant boron with an energy of 500 keV (peak depth of ~1 um) and dose of $10^{13}$ atoms/cm$^3$ to form doping for first portion 121 of p+ buried layer 122; the resultant dopant concentration will be about $10^{17}$-$10^{18}$ atoms/cm$^3$ which corresponds to a resistivity of about 0.1 ohm-cm. Then implant phosphorus with energies of 50, 100, 250, and 500 keV (peak depths up to 0.6-0.7 um) and a total dose of $10^{12}$-$10^{13}$ atoms/cm$^3$ to form dopings (including threshold adjust, punchthrough suppression, and channel stop) for n wells 132; see FIG. 3.

(3) Spin on second photoresist, expose, and develop a pattern for the p wells 134 for NMOS transistors; this pattern overlaps the n well pattern under the shallow trench isolation 130. Next, again implant boron with an energy of 500 keV and dose of $10^{13}$ atoms/cm$^3$ to form doping for the portion of p+ buried layer 122 connecting to portion 121 already implanted in preceding step (2). The projected range of implanted boron in silicon dioxide is comparable to the projected range in silicon, so the shallow trench isolation 130 does not disrupt the connection of the two portions of the buried layer 122. Then implant boron with energies of 20, 60, 100, and 150 keV (peak depths up to 0.6-0.7 um) and total dose of $10^{12}$-$10^{13}$ atoms/cm$^3$ to form dopings (including threshold adjust, punchthrough suppression, and channel stop) for p wells 134; see FIG. 4. Optionally, anneal at 900 C to activate the implants, recrystallize the silicon lattice amorphized by the implants, and diffuse the implants somewhat to form the wells and abutting buried layer. Alternatively, the anneal may be put off until the anneal after implantation of the source/drains in step (5). Note that the p+ buried layer makes electrical contact to the surface (and allows biasing) through the p wells. If high resistivity silicon layer 110 were p-type, then a further connection to p+ buried layer 122 would be available. Of course, for CMOS operation the n wells typically are biased positive relative to the p wells so that the p-n junctions where the wells abut are reversed biased. For example, n wells biased at a positive supply voltage and p wells held at ground.

(4) Form gate dielectric on the surface of silicon layer 110 (this may be silicon dioxide grown with optional nitridation or a deposited high-k dielectric or other dielectric), and then deposit gate material, such as amorphous silicon, on the gate dielectric. Optionally, the gate material can now be selectively doped. Next, spin on third photoresist, expose, and develop a pattern for gates for the PMOS and NMOS transistors. Then plasma etch to form gates 112, and lastly deposit sidewall spacer material (such as silicon nitride) and anisotropically etch to form sidewall spacers on gates 112.

(5) Implant NMOS and PMOS source/drains using corresponding photoresist masks; these implants also dope the corresponding gates. Lateral straggle provides some doping under the sidewall spacers, although optional lightly doped drain implants prior to sidewall spacer formation may be used; see FIG. 5.

(6) Form premetal dielectric (PMD) layer 113, such as by blanket PECVD deposition of silicon dioxide followed by a chemical mechanical polishing for planarization. Then form capacitor 120 by the steps of deposition of lower electrode material (e.g., polysilicon) and patterning, next, capacitor dielectric (e.g., silicon nitride or silicon oxynitride) formation and patterning, and then upper electrode material deposition and patterning. See FIG. 6; dielectric 113 forms the lower portion of dielectric 114 of FIG. 1.

(7) Form the remainder of PMD dielectric layer 114, such as by blanket PECVD deposition of silicon dioxide on dielectric layer 113 and capacitor 120. Then form vias through dielectric 114 to make any needed contacts to the electrodes of capacitor 120 and gates 112 and source/drains.

(8) Form metal microstrip lines 118 and inductor coils 116 and other first metal level interconnects. This is the structure of FIG. 1. Subsequently, form further levels of intermetal level dielectric (IMD) plus metal interconnect levels and vertically connecting vias. Alternative metal levels could be formed with a dual damascene process of first forming a dielectric level, etching vias and trenches in the dielectric, and lastly filling the trenches and vias to form interconnects.

An alternative preferred embodiment method follows the foregoing steps but combines the p well and buried layer implants of step (3) into a single implant with larger dose so that the well depth has the same doping concentration. This saves an implant and still provides a p+ buried layer.

The preferred embodiments can be modified while retaining the features of high resistivity semiconductor for high Q-factor passive together with buried layers for CMOS wells. For example, the buried layer may be n+ with corresponding switching of p-types and n-types. Further, backside low-resistivity layer could be omitted, the silicon semiconductor could be replaced with other semiconductors which may have high resistivity such as GaAs, SiC, and so forth. The number of implants and energies (depths) and dopant types may be varied, and so forth.

The invention claimed is:

1. A method of forming a CMOS structure, comprising the steps of:

forming an isolation region in a semiconductor layer;

forming a first mask having a first void therein on a first surface of said semiconductor layer;

implanting first conductivity-type dopants into said semiconductor layer through said first void to form a first buried region, a portion of said first buried region extending underneath a portion of said isolation region;

implanting second conductivity-type dopants into said semiconductor layer through said first void to form a first well between said first buried region and said first surface, a portion of said first well extending underneath a portion of said isolation region between said isolation region and said first buried region;

forming a second mask having a second void therein on the first surface of said semiconductor layer;

implanting second conductivity-type dopants into said semiconductor layer through said second void to form a second buried region, a portion of said second buried region extending underneath a portion of said isolation region; and implanting second conductivity-type dopants into said semiconductor layer through said second void to form a second well between said second buried region and said first surface, a portion of said second well extending underneath a portion of said isolation region between said isolation region and said second buried region.

2. The method of claim 1, wherein said first buried region is at about the same depth as said second buried region.

3. The method of claim 2, wherein said first buried region abuts said second buried region beneath said isolation region.

4. The method of claim 1, wherein said first well abuts said second well beneath said isolation region.

5. The method of claim 1, wherein said semiconductor layer has a first portion having a first resistivity and a second portion having a second resistivity, said first resistivity being different than said second resistivity.

6. The method of claim 5, wherein said first resistivity is higher than said second-resistivity.

7. The method of claim 6, wherein said first resistivity is about 5 kohm-cm.

8. The method of claim 7, wherein said second resistivity is about 0.01 ohm-cm.

9. The method of claim 5 wherein said first portion has a doping level of about $10^{12}$-$10^{13}$ atoms/cm$^3$.

10. The method of claim 5 wherein said second portion has a doping level of about $10^{19}$ atoms/cm$^3$.

11. The method of claim 5, wherein said second portion forms a contact layer spaced a distance from said first surface.

12. The method of claim 5, wherein said first portion comprises silicon and said second portion comprises one of silicon having a higher doping level than said first portion and metal.

13. The method of claim 5, wherein said first portion and said second portion are of the same conductivity type.

14. The method of claim 5, wherein said first portion and said second portion are of different conductivity types.

15. The method of claim 14, wherein when said first portion is n-type silicon, said second portion is connected to the positive supply line.

16. The method of claim 14, wherein when said first portion is p-type silicon, said second portion is connected to ground.

17. The method of claim 5, wherein said first portion is an epitaxial layer.

18. The method of claim 5 wherein said first portion is a layer having a thickness of about 5 um and the second portion is a layer having a thickness greater than said first portion.

19. The method of claim 1, wherein said implanting first conductivity-type dopants into said semiconductor layer through said first void to form a first buried region is performed using a first energy level and said implanting second conductivity-type dopants into said semiconductor layer through said first void to form a first well between said first buried region and said first surface is performed using a second energy level, said second energy level being less than or equal to said first energy level.

20. The method of claim 1, wherein said implanting second conductivity-type dopants into said semiconductor layer through said second void to form a second buried region is performed at a first energy level and said implanting said second conductivity-type dopants into said semiconductor layer through said second void to form a second well between said second buried region and said first surface is performed at a second energy level, said second energy level being less than said first energy level.

21. The method of claim 1, further comprising the step of annealing said CMOS structure to activate the implants.

22. The method of claim 1, further comprising the steps of:
   forming a gate dielectric on said first surface of said semiconductor layer;
   forming gate material on the gate dielectric;
   forming a third mask on said first surface of said semiconductor layer, exposing and etching a gate;
   forming sidewall spacers on said gate;
   forming a source and a drain adjacent said gate;
   forming a dielectric layer over said first surface of said semiconductor layer and said source, drain and gate.

23. The method of claim 22, further comprising the steps of:
   forming a capacitor within said dielectric layer; and
   forming a microstrip and at least one inductor coil on a surface of said dielectric layer opposite said first surface of said semiconductor layer.

* * * * *

UNITED STATES PATENT AND TRADEMARK OFFICE
CERTIFICATE OF CORRECTION

PATENT NO. : 7,575,969 B2 Page 1 of 1
APPLICATION NO. : 09/798106
DATED : August 18, 2009
INVENTOR(S) : Dirk Leipold It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 393 days.

Signed and Sealed this

Seventh Day of September, 2010

David J. Kappos
*Director of the United States Patent and Trademark Office*